(12) United States Patent
Capolla

(10) Patent No.: US 8,547,641 B2
(45) Date of Patent: Oct. 1, 2013

(54) LINE-PROJECTION APPARATUS FOR ARRAYS OF DIODE-LASER BAR STACKS

(75) Inventor: Nadia Capolla, Ste-Geneviève (CA)

(73) Assignee: Cohernet, Inc., Santa Clara, CA (US)

( * ) Notice: Subject to any disclaimer, the term of this patent is extended or adjusted under 35 U.S.C. 154(b) by 315 days.

(21) Appl. No.: 12/942,877

(22) Filed: Nov. 9, 2010

(65) Prior Publication Data

US 2012/0113996 A1    May 10, 2012

(51) Int. Cl.
*G02B 27/10* (2006.01)

(52) U.S. Cl.
USPC .......................................... 359/625; 359/618

(58) Field of Classification Search
USPC .................. 359/618–625, 627, 726–727, 839, 359/850, 853, 867, 638–641, 495; 372/34, 372/36, 43.01, 50.11, 50.12, 68–71, 75, 93, 372/99, 101, 107–109; 235/462.35; 385/27, 385/31, 33, 36, 39, 88
See application file for complete search history.

(56) References Cited

U.S. PATENT DOCUMENTS

| | | | |
|---|---|---|---|
| 5,148,317 A | 9/1992 | Foresi | |
| 6,313,948 B1 | 11/2001 | Hanna | |
| 6,773,142 B2 | 8/2004 | Rekow | |
| 6,975,458 B1 | 12/2005 | Kanzler | |
| 7,016,393 B2 | 3/2006 | Anikitchev et al. | |
| 7,265,908 B2 | 9/2007 | Anikitchev | |
| 7,355,800 B2 | 4/2008 | Anikitchev | |
| 7,690,787 B2 | 4/2010 | Koschmieder et al. | |
| 2005/0063428 A1 | 3/2005 | Anikitchev et al. | |
| 2005/0063435 A1* | 3/2005 | Imai et al. | 372/43 |
| 2006/0105585 A1 | 5/2006 | Jennings et al. | |
| 2006/0176912 A1 | 8/2006 | Anikitchev | |
| 2007/0009002 A1* | 1/2007 | Guo et al. | 372/50.12 |
| 2007/0139926 A1 | 6/2007 | Anikitchev | |
| 2008/0019010 A1* | 1/2008 | Govorkov et al. | 359/641 |
| 2008/0101429 A1* | 5/2008 | Sipes | 372/50.12 |

FOREIGN PATENT DOCUMENTS

| | | |
|---|---|---|
| EP | 1376198 A1 | 1/2004 |
| WO | 2006/097531 A1 | 9/2006 |

OTHER PUBLICATIONS

International Search Report received for PCT Patent Application No. PCT/US2011/058068, mailed on Sep. 27, 2012, 4 pages.
U.S. Appl. No. 61/380,503, filed Sep. 7, 2010, by Sivarama Krishna Kuchibhotla, entitled Line-Projection Apparatus for Arrays of Diode-Laser Bar Stacks.
International Written Opinion received for PCT Patent Application No. PCT/US2011/058068, mailed on Sep. 27, 2012, 5 pages.
International Preliminary Report on Patentability received for PCT Patent Application No. PCT/US2011/058068, mailed on May 23, 2013, 7 pages.

* cited by examiner

*Primary Examiner* — Dawayne A Pinkney
(74) *Attorney, Agent, or Firm* — Morrison & Foerster LLP

(57) ABSTRACT

In optical apparatus for illuminating a mask-plane with a line of light, a light source includes four fast-axis stacks of laser diode bars with fast and slow axis collimating arrangements providing four collimated beams of diode-laser light. A combination of a lens element and two diffraction gratings collects the four collimated beams and spreads the beams in the fast-axis direction such that the spread beams overlap in the mask plane to form a line of light having a length in the fast-axis-direction and a width in the slow-axis direction of the diode-laser bar stacks.

20 Claims, 11 Drawing Sheets

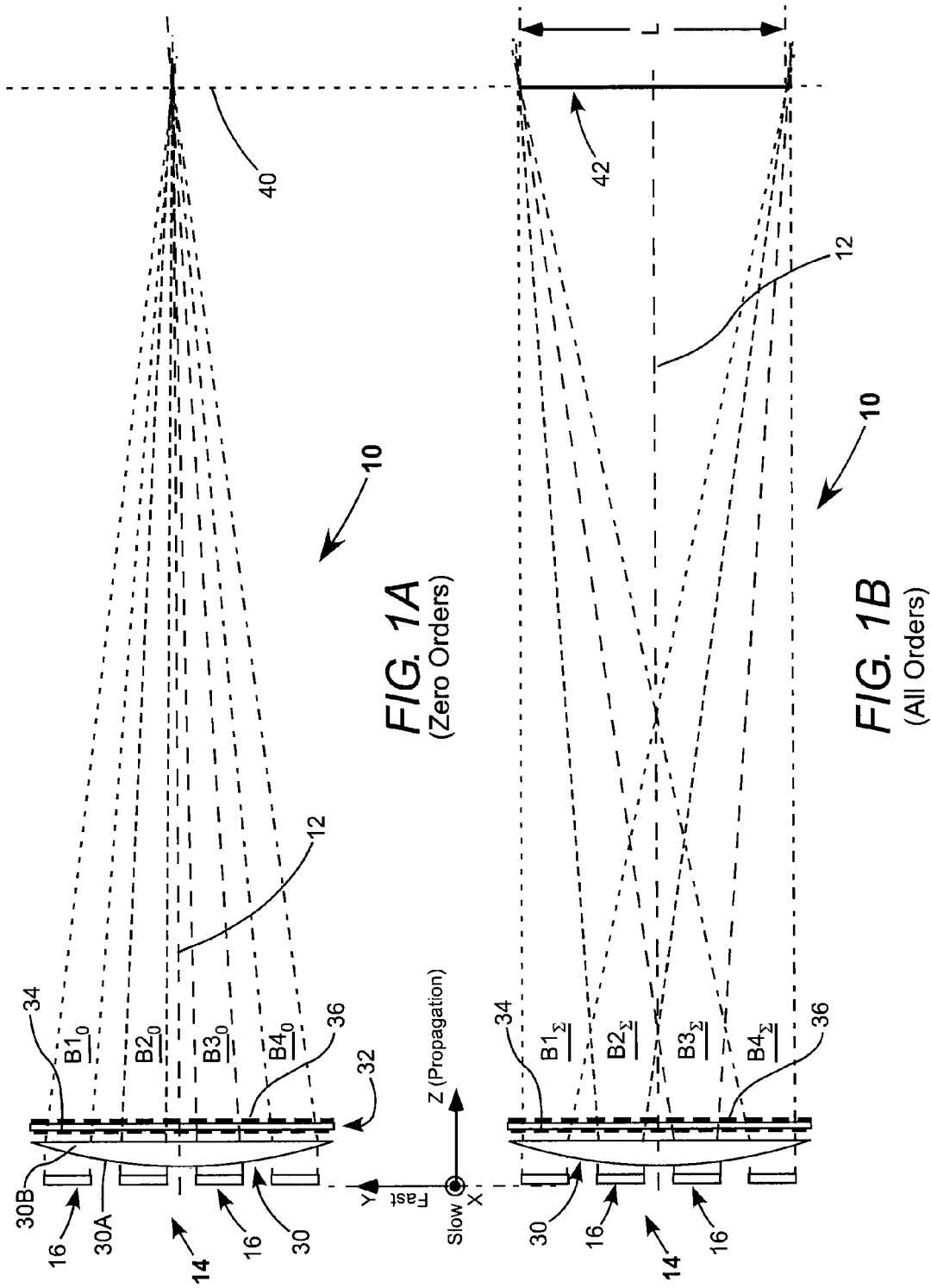

FIG. 4A

| Order No. | Relative Power | Order No. | Relative Power |
|---|---|---|---|
| -40 | 0.007 | 1 | 0.0121 |
| -39 | 0.008 | 2 | 0.0137 |
| -38 | 0.008 | 3 | 0.0131 |
| -37 | 0.007 | 4 | 0.0137 |
| -36 | 0.009 | 5 | 0.0123 |
| -35 | 0.0088 | 6 | 0.0131 |
| -34 | 0.012 | 7 | 0.0131 |
| -33 | 0.0131 | 8 | 0.0126 |
| -32 | 0.0127 | 9 | 0.0134 |
| -31 | 0.0126 | 10 | 0.0129 |
| -30 | 0.0131 | 11 | 0.013 |
| -29 | 0.0128 | 12 | 0.013 |
| -28 | 0.0133 | 13 | 0.013 |
| -27 | 0.0128 | 14 | 0.013 |
| -26 | 0.0131 | 15 | 0.013 |
| -25 | 0.0136 | 16 | 0.0136 |
| -24 | 0.0131 | 17 | 0.0131 |
| -23 | 0.0131 | 18 | 0.0129 |
| -22 | 0.0131 | 19 | 0.0136 |
| -21 | 0.0126 | 20 | 0.0134 |
| -20 | 0.0134 | 21 | 0.0126 |
| -19 | 0.0136 | 22 | 0.0131 |
| -18 | 0.0129 | 23 | 0.0131 |
| -17 | 0.0131 | 24 | 0.0131 |
| -16 | 0.0136 | 25 | 0.0136 |
| -15 | 0.013 | 26 | 0.0131 |
| -14 | 0.013 | 27 | 0.0128 |
| -13 | 0.013 | 28 | 0.0133 |
| -12 | 0.013 | 29 | 0.0128 |
| -11 | 0.013 | 30 | 0.0131 |
| -10 | 0.0129 | 31 | 0.0126 |
| -9 | 0.0134 | 32 | 0.0127 |
| -8 | 0.0126 | 33 | 0.0125 |
| -7 | 0.0131 | 34 | 0.012 |
| -6 | 0.0131 | 35 | 0.088 |
| -5 | 0.0123 | 36 | 0.009 |
| -4 | 0.0137 | 37 | 0.007 |
| -3 | 0.0131 | 38 | 0.008 |
| -2 | 0.0137 | 39 | 0.008 |
| -1 | 0.0121 | 40 | 0.007 |
| 0 | 0.0131 | | |

| Order No. | Relative Power |
|---|---|
| -5 | 0.023 |
| -4 | 0.025 |
| -3 | 0.133 |
| -2 | 0.125 |
| -1 | 0.13 |
| 0 | 0.128 |
| 1 | 0.13 |
| 2 | 0.125 |
| 3 | 0.133 |
| 4 | 0.025 |
| 5 | 0.023 |

*FIG. 4B*

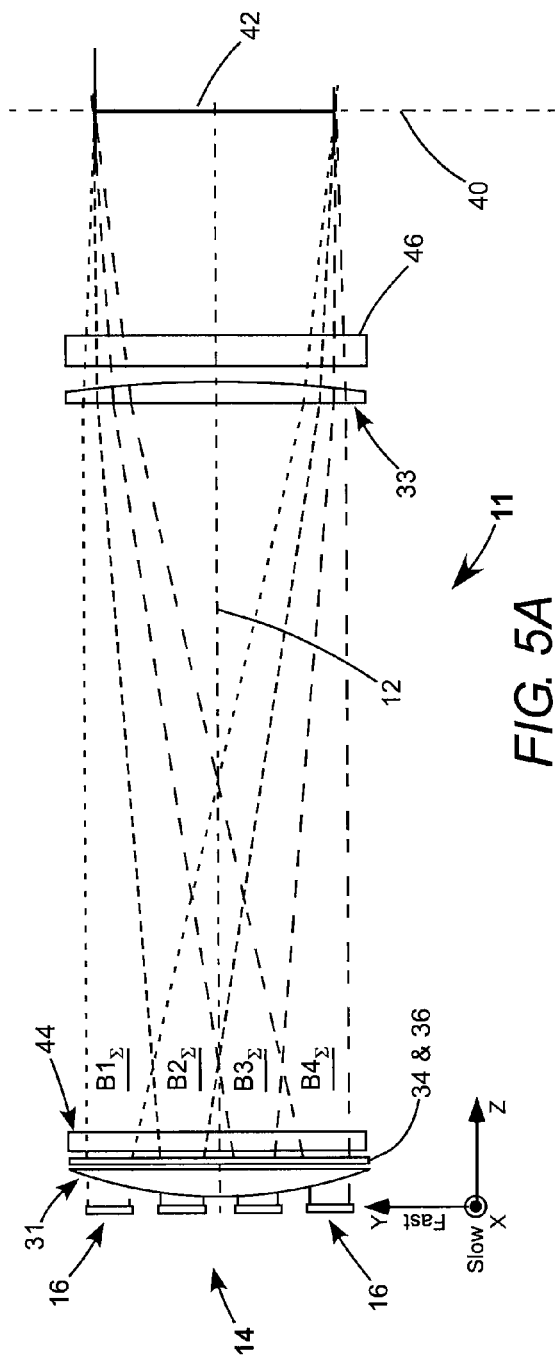
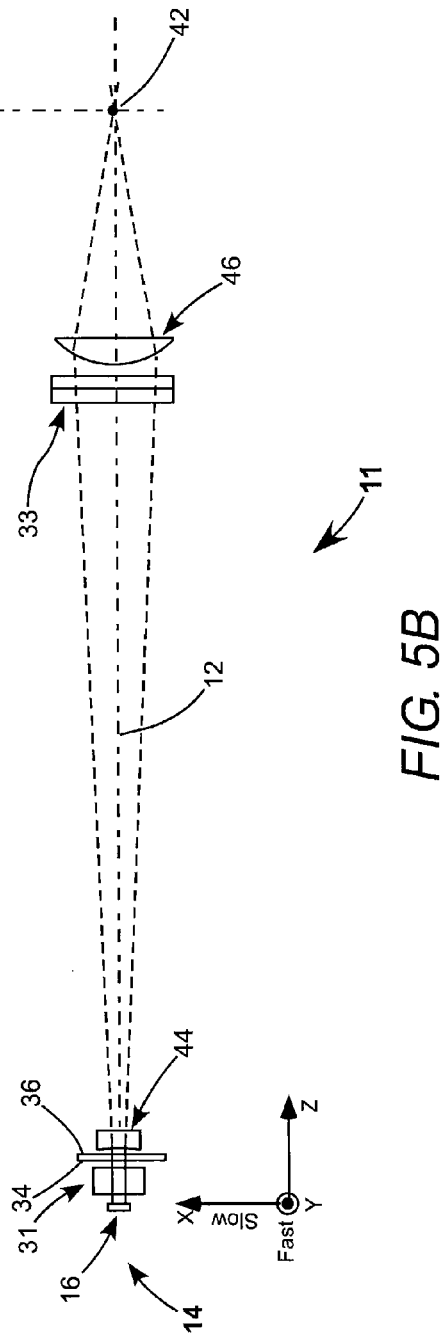
FIG. 5A
FIG. 5B (Zero Orders Only)

LINE-PROJECTION APPARATUS FOR ARRAYS OF DIODE-LASER BAR STACKS

TECHNICAL FIELD OF THE INVENTION

The present invention relates in general to optical apparatus for projecting the output of one or more lasers into a line of light. The invention relates in particular to apparatus for forming very uniform line of light from the output of group of diode-laser bars

DISCUSSION OF BACKGROUND ART

There are several applications for laser radiation projected to form a line of light on a target. Early versions of such line-projection apparatus for diode-lasers were found in bar-code readers and the like. Here, however, uniformity of illumination along the line was at most a secondary consideration.

Later versions of diode-laser line projection apparatus were developed for spatial light modulators (SLMs) in laser printers, image projectors, and the like. Here, power in the line of light was not required to be very high, and could be delivered by a simple one-dimensional laser array, commonly referred to as a diode-laser bar. Uniformity of illumination along the line of light in these applications is important. An "ideal" line of radiation requires a Gaussian intensity distribution of intensity in the width of the line and a uniform or "flat-top" distribution along the length of the line. This uniformity requirement encouraged the invention of projection optics that would provide adequate uniformity. Examples of such projection optics are described in U.S. Pat. No. 6,773,142; U.S. Pat. No. 7,016,393; U.S. Pat. No. 7,265,908, and U.S. Pat. No. 7,355,800, all of which are assigned to the assignee of the present invention.

A recent application for a projected line of diode-laser light is in patterning operations for organic light emitter displays. Here the line of light illuminates a mask having apertures defining emitter features for one primary color of the display. The illuminated features are projected by a projection lens onto a donor foil coated with a layer of organic emitting material for that color. This process sometimes referred to as laser induced thermal imaging (LITI). Exposed regions of the foil are transferred to an active matrix back-plate of the display. The process is repeated for building different primary colors of the display. The process is commercially more effective the longer the line of light that can be projected, and the higher the intensity of the light in the line. The intensity is dependent, for any given line-length, on the power of the illumination and the narrowness of the line More laser power provides that a longer line can be projected at a given illumination intensity. Preferred line lengths for OLED manufacture greatly exceed the length of lines of light used for illuminating SLMs which are typically only about 25 millimeters (mm) long. A desirable line-of-light for OLED manufacturers would have a length of at least about 200 mm and a width of about 10.0 mm or less, with about 5 kilowatts (kW) total power delivered into the line. The line would preferably have Gaussian distribution of intensity in the line width, and a uniform ("flat top") distribution in the line-length. Depending on the optical efficiency of the illuminating apparatus, this would require a diode-laser source with a total power in excess of about 7 kW. As the power available from a typical multimode diode-laser bar is only on the order of 70 Watts (W), such a 7 kW-source would require about 100 diode-laser bars.

Each emitter has a height (in what is usually referred to as the fast-axis) of about 2 micrometers (μm) and a width (in what is usually referred to as the slow-axis) of about 100 μm. The ratio of the total width of emitters to the length of the diode-laser bar is usually referred to as the fill-factor. Each emitter delivers an astigmatic beam having a divergence in the fast-axis of about 35°, but a substantially Gaussian intensity cross-section, and a divergence in the slow-axis of about 10° but a more complex intensity cross-section. Two-dimensional arrays of diode-laser emitters have been made by stacking diode-laser bars in the fast-axis direction in diode-laser bar modules. However, each diode-laser bar must be individually cooled, and there is a practical limit to how many can be stacked in a module, dependent, inter alia, on selecting sufficient bars from a batch with adequate specifications. Certainly modules with 100 fast-axis stacked bars are not commercially available at present and it is believed that 100-bar stacks may not be available at economical cost, if at all for many years into the future.

It is to be expected that a multi-kilowatt diode-laser source will comprise some arbitrary array of such diode-laser-bar stacks, providing a two dimensional array of individual emitters. The emitters will be in a non-uniform, however symmetrical, distribution, with each emitter delivering a non-uniform beam with not necessarily the same non-uniformity. There is a need for an optical arrangement capable of delivering from such a source a line of radiation having a length of 200 mm or greater and a width of 10.0 mm or less with a Gaussian or near-Gaussian distribution of intensity in the line-width, and a uniform distribution of intensity in the line-length.

SUMMARY OF THE INVENTION

In one aspect of the present invention, optical apparatus for forming a line of radiation having a length and a width in a working plane at a working distance from the apparatus, comprises a plurality of spaced-apart stacks of laser-diode bars. Each of the diode-laser bars has a plurality of diode-laser emitters, and has a fast-axis and a slow-axis perpendicular to the fast-axis and parallel to a length dimension of the bars. The diode-laser bars in the stacks stacked in the fast-axis direction thereof. A plurality of collimating arrangements corresponding in number to the number of diode-laser bars is provided for collimating the output radiation of the diode-laser bars in the diode-laser bars stacks in at least the fast-axis direction, thereby forming a plurality of output-radiation beams corresponding in number to the plurality of diode-laser bar stacks. One or more lens elements are provided having optical power in the fast-axis or the slow-axis only, and one or more diffractive optical elements are provided. The combination of the one or more lens elements and the one or more diffractive optical elements is configured and arranged to spread the plurality of output radiation beams from the stacks of diode-laser bars into the line of radiation in the working plane such that each beam contributes about equally to the length of the line of radiation.

In a preferred embodiment of the apparatus there is only one lens element but two diffractive optical elements. One of the diffractive optical elements is primarily responsible for the spreading and the other for improving uniformity of irradiance along the length of the line of illumination. Calculations indicate that this embodiment is capable of forming a line of radiation having a length of about 260 mm and a width of about 10 mm from four spaced-apart diode-laser bar stacks, each including 26 diode-laser bars. Assuming that each diode laser bar has an output 70 W for a total source power of 7.28 kW, calculations indicate that in the case of both embodiments in excess of 4.6 kW of radiation will be delivered into the 260 mm×10 mm line of radiation. In practice however the actual power in the line may be somewhat less dependent on the efficiency achievable with the diffractive elements.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

FIG. 1A is a fast-axis view schematically illustrating one preferred embodiment of line-illuminating apparatus in accordance with the present invention having a light source including four fast-axis diode-laser bar-stack modules aligned one above the other in the fast-axis-direction of the stacks, a lens and a first and second diffractive elements, the lens focusing zero orders of the diffractive element in the fast-axis and slow-axis direction of the diode-laser bar-stack modules in a focal plane of the lens.

FIG. 1B is a fast-axis view schematically illustrating the apparatus of FIG. 1A with the first diffractive element spreading slow-axis collimated, higher diffraction-orders of the first diffractive element in the fast axis direction in the focal plane to form a line of light having a length in the fast-axis direction and a width in the slow axis direction, and the second diffractive element homogenizing intensity distribution in the fast-axis direction of the line of light.

FIG. 4A is a table depicting assumed relative power as a function of diffraction order for the first diffractive element in the calculations of FIGS. 3A, 3B and 3C.

FIG. 4B is a table depicting assumed relative power as a function of diffraction order for the second diffractive element in the calculations of FIGS. 3B and 3C.

FIG. 5A is a fast-axis view schematically illustrating another preferred embodiment of line-illuminating apparatus in accordance with the present invention similar to the apparatus of FIGS. 1A and 1B but wherein the line of light is formed by first and second lenses and the diffractive elements, and wherein there are third and fourth lenses for focusing in the slow-axis.

FIG. 5B is a slow-axis view schematically illustrating slow-axis focusing by the third and fourth lenses of FIG. 5A.

DETAILED DESCRIPTION OF THE INVENTION

Figure 1C:
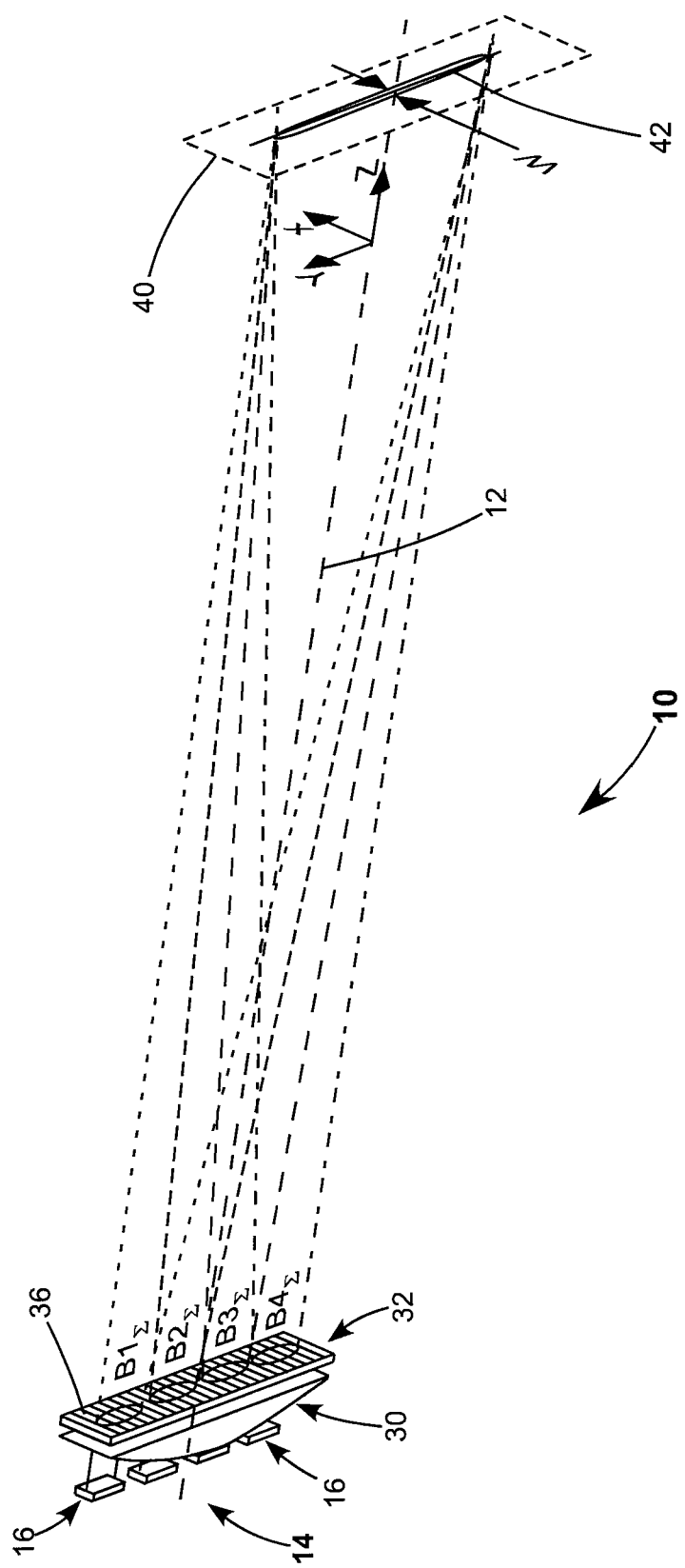
FIG. 1C is a three-dimension view schematically illustrating further details of the preferred embodiment of the inventive apparatus as depicted in FIG. 1B.

Referring now to the drawings, wherein like components are designated by like reference numerals, FIG. 1A is a fast-axis view schematically illustrating one preferred embodiment 10 of line-illuminating apparatus in accordance with the present invention. Apparatus 10 has an optical axis 12.

Apparatus 10 has a light-source 14 including four fast-axis diode-laser bar-stack modules 16 aligned one above the other in the fast-axis-direction of the stacks. In the description of apparatus 10 set forth below the apparatus is also described, for convenience of description, as having a fast-axis and a slow-axis corresponding to the same axes of the diode-laser bars. These can also be arbitrarily designated respectively as the Y-axis and the X-axis, corresponding to the tangential and sagittal axes of optics in the apparatus. The propagation axis (Z-axis) of the diode-laser bar stacks is parallel to optical axis 12.

Figure 2A:
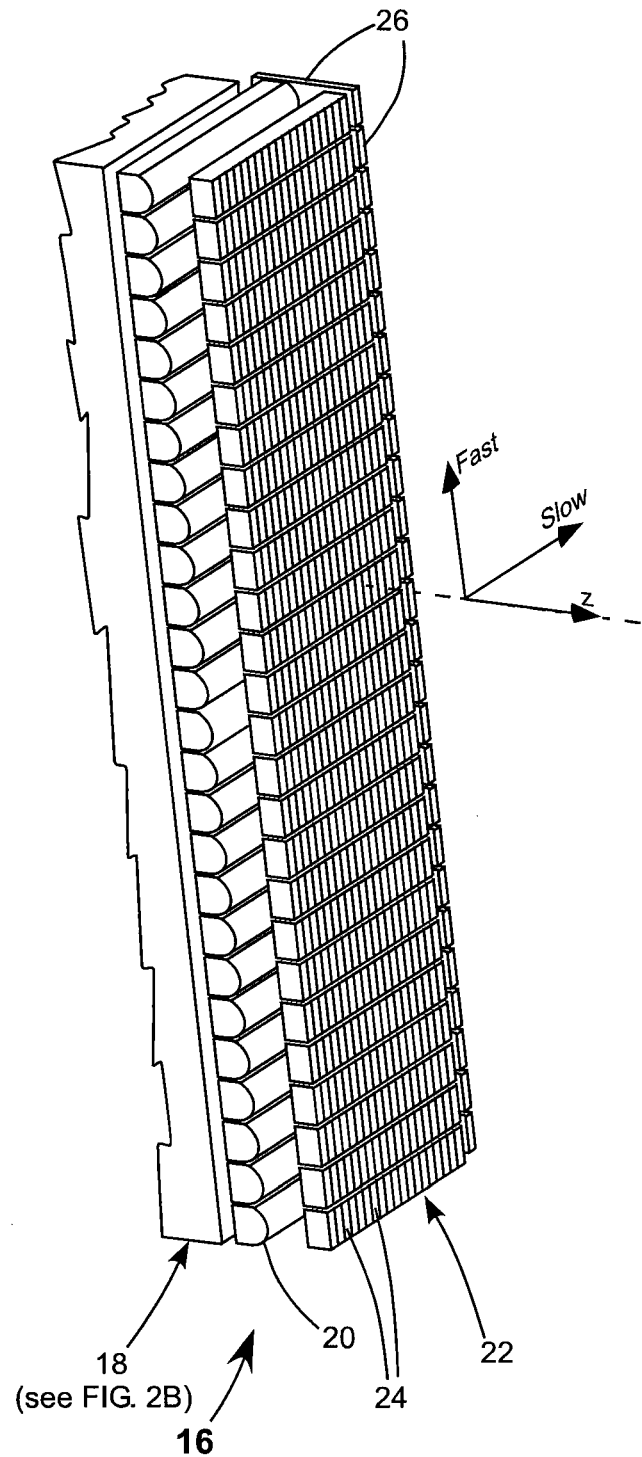
FIG. 2A is three-dimensional view schematically illustrating one of the diode-laser bar-stack modules of the apparatus of FIGS. A and 1B including a fast-axis diode-laser bar stack a fast-axis collimating lens for each diode-laser bar and a slow-axis collimating lens for each emitter of each diode-laser bar.
Figure 2B:
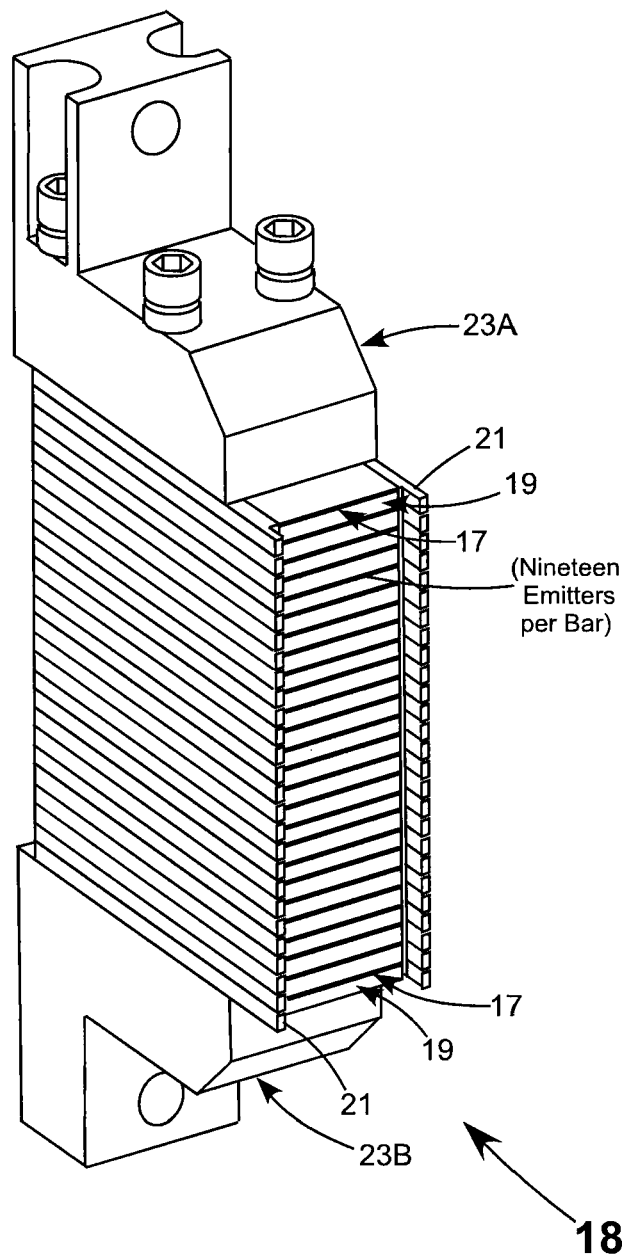
FIG. 2B is a three-dimensional view schematically illustrating details of the diode-laser bar stack of FIG. 2A.

FIG. 2A is a three-dimensional view schematically illustrating details of diode-laser module 16. The module includes a fast-axis diode-laser bar stack 18 here assumed to be a stack of twenty-six (26) diode-laser bars. Details of one-example of the stack construction are depicted in FIG. 2B. Here, each diode-laser bar 17 is mounted on the front of a corresponding heat sink member 19. The heat-sink members are clamped together between clamping and mounting blocks 23A and 23B. Each heat-sink member has a forward-extending portion 21, to which a fast-axis collimating (FAC) lens or a module including a FAC lens and a slow-axis collimating (SAC) lens array can be attached.

Referring again to FIG. 2A, each of the diode laser bars has a dedicated cylindrical fast-axis collimating (FAC) lens 20, which, as the name suggests, collimates light from each emitter in the bar in the highly divergent fast-axis direction. There are twenty-six lenses 20. Spaced apart from each FAC lens in the z-axis direction is an array 22 of cylindrical slow-axis collimating (SAC) lenses 24. The number of lenses 24 in each array 22 corresponds with the number of spaced-apart emitters (diode-lasers) in each of the diode-laser bars. Here, it is assumed that there are nineteen (19) emitters in each bar. Each SAC lens is aligned with a corresponding emitter. The FAC lenses and SAC lens-arrays are held in alignment with each other by brackets 26 (shown on only one side in FIG. 2 for convenience of illustration). Assemblies of FAC and SAC lenses are available from several commercial suppliers.

The cylindrical FAC and SAC lenses are preferably spaced apart in the Z-axis by a distance just sufficient to allow the slow-axis diverging beam from each emitter to almost fill a corresponding SAC lens 24. This distance will depend in any example on the actual divergence, and the emitter-width and spacing (the fill factor). In the example under consideration it is assumed that the emitter width is 100.0 µm, the emitter pitch is 0.5 mm, and the spacing between the FAC and SAC lenses is 3.0 mm.

It is pointed out, here, that collimation of the light from the diode-laser emitters will never be perfect this is due, inter alia, to the relatively poor beam-quality of a beam from a diode-laser emitter, the relative simplicity of the collimating lenses and to misalignment of emitters in any bar along the slow-axis, a manufacturing artifact, whimsically referred to by practitioners of the art as "smile". This "smile" will vary from bar to bar.

It should be noted that the term "cylindrical" as applied to lenses referred to in this description and the appended claims, refers to any lens that has finite optical power in only one of two orthogonal axes. The term is applicable, for convenience of description, to lenses where optical power is supplied by a pure cylindrical surface or a convex or concave surface having a more complex, i.e., "acylindrical" form.

Referring again to FIG. 1A, apparatus 10 includes a cylindrical lens 30 having a convex entrance surface 30A and a plane exit surface 30B, providing the lens with positive optical power in the Y-axis (fast-axis). Following lens 30 is a plane parallel substrate 32 with diffractive elements 34 and 36 formed on respectively entrance and exit surfaces thereof. A preferred material for substrate 32 is fused silica.

For purposes of this description it is assumed that the diffractive elements are diffraction gratings, etched into the substrate surface, with straight parallel patterns having a regular spacing. The patterns in each element are arranged parallel to the X-axis (slow-axis) of apparatus 10. Other, more complex diffractive-element forms may be used without departing from the spirit and scope of the present invention.

Lens 30 is configured to bring collimated beams from the diode-bar stacks arrays to a focus on the optical axis in a focal plane 40 at a predetermined axial distance (corresponding to a desired working distance) from the lens in the absence of diffractive elements 32 and 34. In the presence of the diffractive elements, only the zero orders $B1_0$, $B2_0$, $B3_0$, and $B4_0$, of the diffracted beams would be brought to a focus on the optical axis in plane 40, as depicted in FIG. 1A. All other orders would be brought to a focus along a line (not shown) in the focal plane corresponding to the desired line of light.

Referring to FIG. 1B and FIG. 1C, diffractive element 32 is arranged to provide sufficient diffraction orders to spread the radiation from each diode-laser bar-stack, received from lens 30, into a line of light 42 having a desired length L in the Y-axis. The spread beams from each diode-laser bar-stack, designated $B1_\Sigma$, $B2_\Sigma$, $B3_\Sigma$, and $B4_\Sigma$, are caused by lens 30 to overlap in focal plane 40 such that each diode-laser bar stack contributes about equally to illumination in the line. Diffractive element 36 is configured to provide significantly less diffractive orders than are provided by diffractive-element 34 and serves primarily to provide additional fast-axis uniformity of illumination in line 42. As lens 30 has zero power in the slow-axis (X-axis), beams $B1_\Sigma$, $B2_\Sigma$, $B3_\Sigma$, and $B4_\Sigma$ retain the slow-axis collimation provided by the slow-axis-collimating lens arrays 22 of the diode-laser bar-stacks such that width (W) of the line is about equal to the length of diode-laser bars in the stacks.

The performance of one example of apparatus 10 configured to provide a line of light 42 having a length of about 260 mm at a working distance of about 1100 mm was calculated using ZEMAX® optical design software available from ZEMAX Development Corporation, of Bellevue, Wash. In this example, the following assumptions were made.

Each diode laser bar has 19 emitters with a 0.5 mm pitch between emitters. There are 26 diode-laser bars in each stack with a pitch of 1.65 mm between the bars in the stack. Each bar has a FAC lens and a SAC lens-array as described above. The stacks are spaced apart by 30 mm along the fast-axis direction. Each bar has a total of 70 W output at a wavelength of 980 nanometers (nm) providing a total light source power of 7280 W (7.280 kW).

Lens 30 is a fused silica lens element having an axial thickness of 25.0 mm with surface 30A having a radius of curvature (ROC) of 480.0 mm and surface 30B being planar. Element 30 is axially spaced from the slow-axis-collimating lens arrays by a distance of 11.0 mm. The working distance is assumed to be 1100 mm.

Diffractive element 34 is assumed to be a "real" regular parallel periodic diffraction grating having a period of 250.00 micrometers and providing sixty-nine (69) "required" diffraction orders (zero±34) plus twelve (12) higher orders (±35-40) that are an anticipated artifact of the grating-manufacturing process. These higher orders have about an order-of-magnitude less relative power than the required orders, but that power must still be taken into account in calculation. The assumed relative power of all orders is given in tabular form in FIG. 4A. The sixty-nine required orders, at the diode-laser wavelength of 980 nm, provide a total beam-spread of 15.32 degrees (calculated from the well-known grating equation). Diffractive element 36 is assumed to be a "real" regular parallel periodic diffraction grating having a period of 333.33 micrometers (µm) and providing seven (7) "required" diffraction orders (zero±3) plus two (2) higher orders (±4 and 5). The seven required orders, at the diode-laser wavelength of 980 nm, provide a total beam-spread of 1.01 degrees. The assumed relative power of all orders is given in tabular form in FIG. 4B. Diffractive elements 34 and 36 while described here as being supported on a single substrate could be supported on separate substrates. Diffractive element 34 is axially spaced 10.0 mm from lens 30, and 3.2 mm from diffractive element 36.

In the ZEMAX calculations, the gratings are represented by what is referred to as a "frequency". This is not a frequency as such, but is the reciprocal of the period in micrometers, i.e., "lines" per micrometer). Here, it should be noted that the "frequency" input to ZEMAX, cooperative with the input wavelength, determines the diffraction angle of each of an input number of orders, above-discussed.

The input relative power in the orders and the diffraction angles thereof are used in the calculation of illumination intensity in a specified plane, but the software does not know, and does not need to know, how providing a particular number of orders and the relative power therein is accomplished. In practice, the relative power in the orders is determined by what is "between-the-lines", that is to say, the lines are not lines as such, but (regular, in this example) repetitions of some microscopic surface-pattern that can produce the input values. Once these input values have been determined, the values can be supplied to a commercial supplier of gratings and other diffractive elements and that supplier will determine an appropriate repeated surface-pattern for providing the values in practice. One commercial supplier of diffractive elements is Jenoptik GmbH, of Jena, Germany.

Figure 3A:
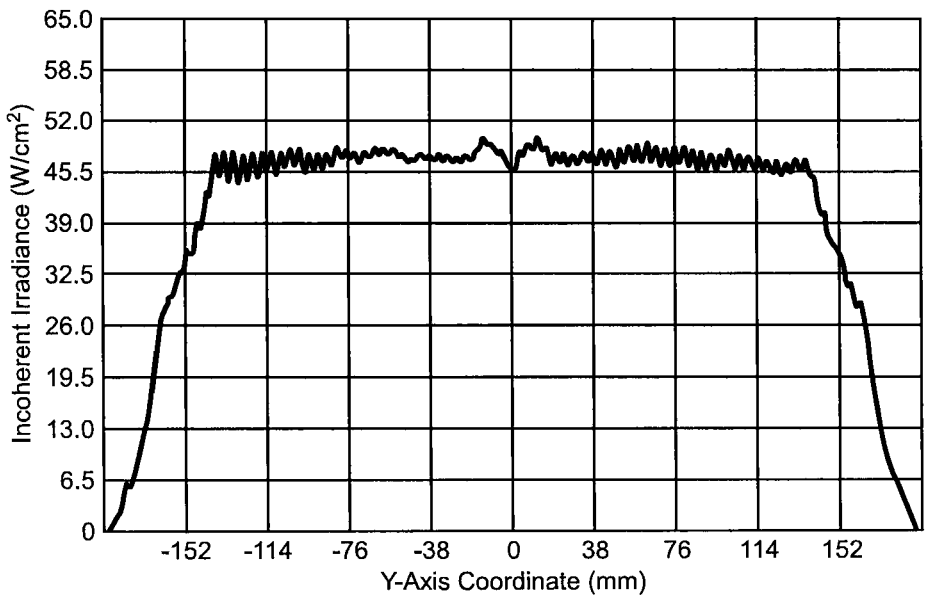
FIG. 3A is graph schematically illustrating calculated intensity distribution as a function of fast-axis coordinate, near the focal plane for one example of the apparatus of FIGS. 1A and 1B but without the second diffractive element.

FIG. 3A is graph schematically illustrating calculated radiation intensity distribution along line of light 42 as a function of fast-axis coordinate, near the focal plane for one example of the apparatus of FIGS. 1A-C but without diffractive element 36. It can be seen that the intensity distribution along the line is relatively "flat-topped" but has considerable modulation giving rise to non-uniformity of about 15%.

Figure 3B:
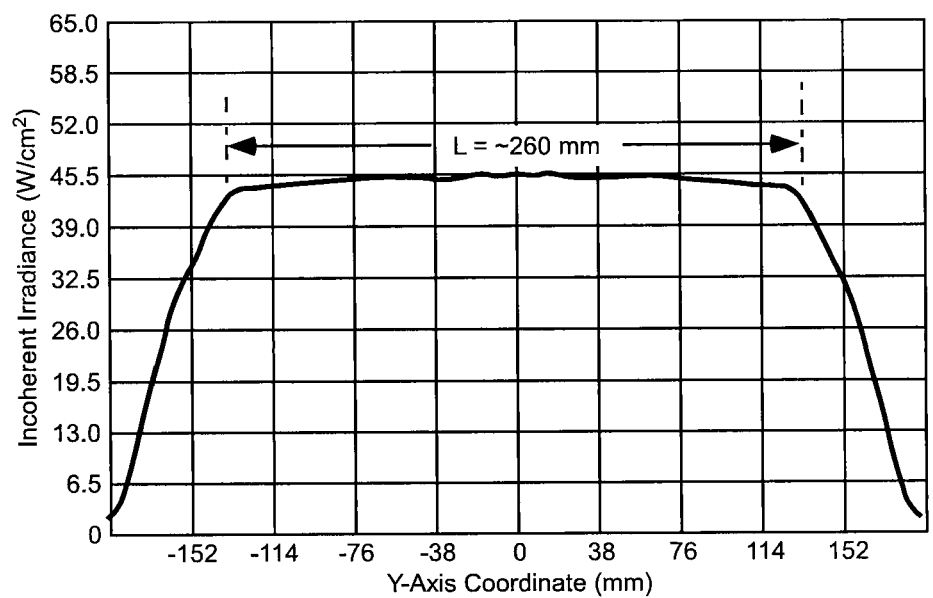
FIG. 3B is graph schematically illustrating calculated intensity distribution as a function of fast-axis coordinate, near the focal plane for another example of the apparatus of FIGS. 1A and 1B with the second diffractive element.

FIG. 3B is graph schematically illustrating calculated radiation intensity distribution along line of light 42 as a function of fast-axis coordinate, near the focal plane for another example of the apparatus of FIGS. 1A-C similar to the example of FIG. 3A but including diffractive element 36. It can be seen that the modulation of the FIG. 3A is essentially eliminated, such that non-uniformity of illumination is reduced to about 5%. The length (L) of the line in this uniform section is about 260 mm. Comparing the distributions of FIGS. 3A and 3B, it can be seen that diffractive element 36 has negligible effect on the length of line of light 42. This is to be expected because of the relatively small beam-divergence introduced by the element as discussed above.

Figure 3C:
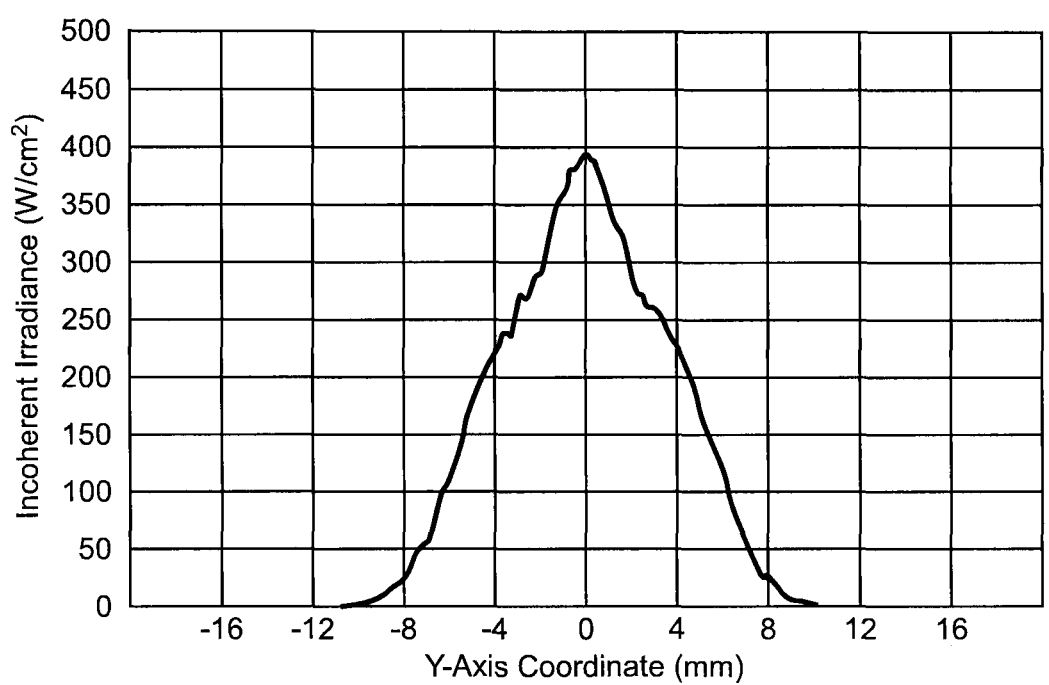
FIG. 3C is a graph schematically illustrating calculated intensity distribution as a function of slow-axis coordinate, near the focal plane for the example of FIG. 3B.

FIG. 3C is a graph schematically illustrating calculated intensity distribution as a function of slow-axis coordinate, near the focal plane for the example of FIG. 3B. The width (W) of the line, measured at the 50% peak transmission points, is about 10.0 mm, which is comparable to the length of individual diode-laser bars in the diode-laser bar stacks. This is to be expected, as no slow-axis focusing of the collimated beams from the diode-laser bar-stack modules occurs.

In the calculations it is assumed that the total power emitted by light-source 14 is 7.28 kW, as discussed above. The calculated total power in line 42 is about 4.66 kW with a peak-irradiance of about 47.2 Watts per square centimeter (W/cm$^2$).

It should be noted here that apparatus 10 is a relatively simple arrangement of the inventive apparatus, including only three optical elements (over and above the collimating optics for the diode-lasers) which can produce a line of acceptable length and illumination (irradiance) uniformity. Other optical elements can be provided for further improving uniformity or reducing the width of the line, without departing from the spirit and scope of the present invention.

By way of example FIG. 5A and FIG. 5B are respectively fast axis and slow axis views schematically illustrating another preferred embodiment 11 of line-illuminating apparatus in accordance with the present invention. Apparatus 11 is similar to apparatus 10 of FIGS. 1A and 1B with exceptions as follows.

In apparatus 11, lens 30 of apparatus 10 is replaced by lenses 31 and 33 for spreading all diffraction orders (beams $B1_\Sigma$, $B2_\Sigma$, $B3_\Sigma$, and $B4_\Sigma$) from diffractive element 34 into a line of light in focal plane 30. This provides additional surfaces that can be used for improving fast-axis uniformity in line of light 42. Lenses 31 and 33 are cylindrical lenses having (positive) optical power in the fast-axis and zero optical power in the slow-axis.

Apparatus 11 additionally includes cylindrical lenses 44 and 46, having optical power in the slow-axis only, for focusing all diffracted orders in plane 40. Here, lens 44 has negative optical power in the slow-axis and zero optical power in the fast-axis, and lens 46 has positive optical power in the slow-axis and zero optical power in the fast-axis, with the combination having net positive optical power in the slow-axis. This focusing arrangement can provide a line having a width less than 2.0 mm. The line width will depend inter alia on the magnification provided by elements 44 and 46, and the light-source width and intensity distribution in the slow-axis.

Figure 5C:
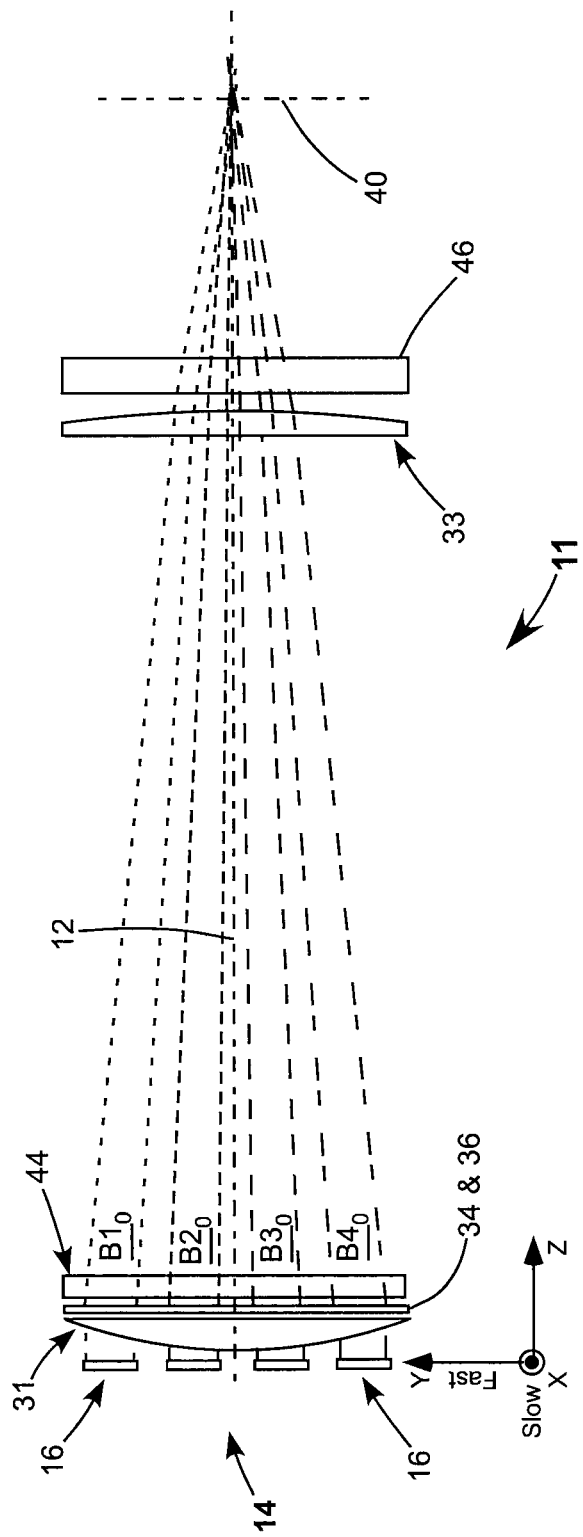
FIG. 5C is a fast-axis view schematically illustrating fast axis focusing of zero orders of diffraction by the first and second lenses in the apparatus of FIG. 5A.

Referring now to FIG. 5C, it should be noted that, like lens 30 in apparatus 10, lenses 31 and 33 are selected to focus zero-orders ($B1_0$, $B2_0$, $B3_0$, and $B4_0$) on optical axis 12, in plane 40 in which the beams are spread by diffractive element 32 to form the length of line of light 42. Those skilled in the optical art will recognize that it is possible to use three or more lenses (lens elements) for the fast-axis zero-order focusing and slow-axis focusing, including positive elements and negative elements. In each case, however, the combination of elements must have net positive optical power.

In apparatus 10 and apparatus 11 described above, the light source is arranged to provide a line of light having a length in the fast-axis direction of the diode-laser bar stacks therein. It is also possible to configure the light-source to favor providing a line of light having a length in the slow-axis direction of the diode-laser bar stacks.

Figures 6A, 6B:
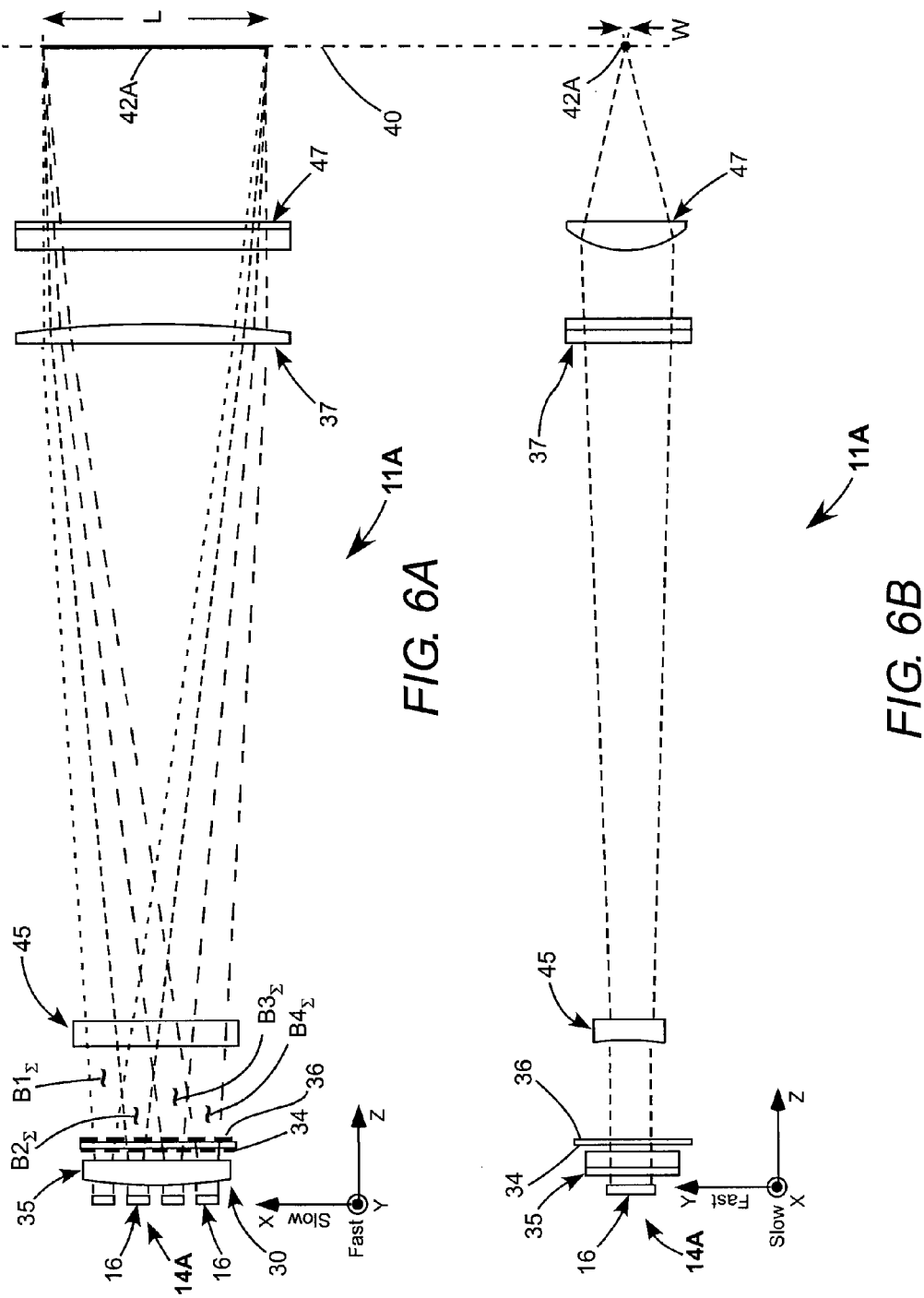
FIG. 6A is a slow-axis view schematically illustrating another preferred embodiment of line-illuminating apparatus in accordance with the present invention similar to the apparatus of FIGS. 5A and 5B but wherein the light source and apparatus are configured and arranged such that the line of light has a length in the slow-axis direction and a width in the fast-axis direction.
FIG. 6B is a fast-axis view schematically illustrating focusing in the fast axis direction to form the width of the line of light.

By way of example FIG. 6A and FIG. 6B are respectively slow-axis and fast-axis views schematically illustrating yet another embodiment 11A of line-illuminating apparatus in accordance with the present invention. Apparatus 11A is similar to apparatus 11 of FIGS. 5A and 5B with an exception that light source 14 of apparatus 11 is replaced in apparatus 11A with a light source 14A in which four diode-laser bar stacks 16 are aligned with each other in the slow-axis direction and the "lines" of diffractive elements are now parallel to the fast-axis direction (perpendicular to the slow-axis direction) of the diode-laser bars such that line beams from the light source are spread into a line of light 42A that has a length (L) in the slow-axis and a width (W) in the fast-axis. Cylindrical lens elements 35 and 37 have positive optical power in the slow-axis and zero optical power in the fast-axis and have the same function as elements 31 and 33 in apparatus 11. Cylindrical lens element 45 has negative optical power in the fast-axis and zero optical power in the slow-axis. Element 47 has positive optical power in the fast-axis and zero optical power in the slow-axis. Elements 45 and 47 have the same function as elements 44 and 46 in apparatus 11.

In the description of embodiments of the present invention provided above diffractive elements 34 and 36 are assumed to be gratings having parallel periodic regular features. As noted, however, one or more of these diffractive elements may have another form. By, way of example, patterns could be linear and parallel but aperiodic (chirped); patterns could be nonlinear and periodic or aperiodic; or patterns could take the form of a two-dimensional array of isolated features of the same or different sizes or shapes. Any of these diffractive-element forms may be used without departing from the spirit and scope of the present invention.

Clearly, however, using complex diffractive element forms could increase the calculation burden and could increase the manufacturing cost of actual elements. Similarly, adding refractive optical elements for focusing in either the fast-axis or slow-axis will increase the manufacturing cost of the inventive apparatus. Given the above-discussed excellent results of the relatively simple arrangement of apparatus 10 of FIG. 1B, it would be prudent to weigh this extra cost against the incremental improvement that may result.

All embodiments of the present invention are designed for use with incoherent light sources such as the diode-laser bar stack arrays described above. There is no reliance on interference in the working plane to provide the uniformity. This provides that there is a reasonable margin of error for the working distance of the illumination apparatus.

In summary, the present invention is described above in terms of a preferred and other embodiments. The invention is not limited, however, to the embodiments described and depicted. Rather the invention is limited only by the claims appended hereto.

What is claimed is:

1. Optical apparatus for forming a line of radiation having a length and a width in a working plane at a working distance from the apparatus, the apparatus comprising:
  a plurality of spaced-apart stacks of diode-laser bars, each of the diode-laser bars having a plurality of diode-laser emitters, and having a fast-axis and a slow-axis perpendicular to the fast-axis and parallel to a length dimension of the bars, the diode-laser bars in the stacks stacked in the fast-axis direction thereof;
a plurality of collimating arrangements corresponding in number to the number of diode-laser bars for collimating the output radiation of the diode-laser bars in the diode-laser bars stacks in at least the fast-axis direction, thereby forming a plurality of output-radiation beams corresponding in number to the plurality of diode-laser bar stacks;
one or more lens elements having optical power in one of the fast-axis and slow-axis only;
one or more diffractive optical elements; and
wherein the combination of the one or more lens elements and the one or more diffractive optical elements is configured and arranged to spread the plurality of output-radiation beams from the stacks of diode-laser bars into a line of radiation in the working plane such that each beam contributes about equally to the length of the line of radiation.

2. The apparatus of claim 1, wherein the diode-laser bar stacks are aligned with each other in the fast-axis direction, the one or more lens elements have optical power in the fast-axis only and the length of the line of radiation is in the fast-axis direction.

3. The apparatus of claim 2, wherein there are four diode-laser bars stacks.

4. The apparatus of claim 2, wherein there are first and second optical elements having optical power in the fast-axis, only and the first and second optical elements each have positive optical power in the fast-axis.

5. The apparatus of claim 4, further including a plurality of optical elements each thereof having optical power in the slow-axis only and arranged to focus the output-radiation beams in the slow-axis in the working plane.

6. The apparatus of claim 5, wherein there are third and fourth optical elements having optical power in the slow-axis only the third optical element having negative optical power and the fourth optical element having positive optical power and the combination having net positive optical power.

7. The apparatus of claim 1, wherein the diode-laser bar stacks are aligned with each other in the slow-axis direction, the one or more lens elements have optical power in the slow-axis only and the length of the line of radiation is in the slow-axis direction.

8. The apparatus of claim 7, wherein there are four diode-laser bars stacks.

9. The apparatus of claim 8, wherein there are first and second optical elements having optical power in the slow-axis, only and the first and second optical elements each have positive optical power in the slow-axis.

10. The apparatus of claim 9, further including a plurality of optical elements each thereof having optical power in the fast-axis only and arranged to focus the output-radiation beams in the fast-axis in the working plane.

11. The apparatus of claim 10, wherein there are third and fourth optical elements having optical power in the fast-axis only the third optical element having negative optical power and the fourth optical element having positive optical power and the combination having net positive optical power.

12. The apparatus of claim 1, wherein the length of the line is greater than about 200 millimeters.

13. The apparatus of claim 1, wherein there are first and second diffractive optical elements the first diffractive optical element being configured to provide the spreading of the output radiation beams, and the second optical element being configured to optimize uniformity of illumination along the line of radiation.

14. The apparatus of claim 13, wherein the diffractive optical elements are diffraction gratings having parallel features arranged about perpendicular to the length direction of the line of radiation.

15. The apparatus of claim 14, wherein the first diffraction grating is arranged to provide a first number of diffraction orders and the second diffraction grating is arranged to provide a second number of diffraction orders, the first number of diffraction orders being greater than the second number of diffraction orders.

16. The apparatus of claim 15, wherein the first diffraction grating is configured to provide sixty-nine diffraction orders including the zero order, and the second diffraction grating is configured to provide seven diffraction orders including the zero order.

17. Optical apparatus for forming a line of radiation having a length and a width in a working plane at a working distance from the apparatus, the apparatus comprising:
a plurality of spaced-apart stacks of diode-laser bars, each of the diode-laser bars having a plurality of diode-laser emitters, and having a fast-axis and a slow-axis perpendicular to the fast-axis and parallel to a length dimension of the bars, the diode-laser bars in the stacks stacked in the fast-axis direction thereof, and the diode-laser bar stacks being aligned with each other in the fast-axis direction;
a plurality of collimating arrangements corresponding in number to the number of diode-laser bars for collimating the output radiation of the diode-laser bars in the diode-laser bars stacks in at least the fast-axis direction, thereby forming a plurality of output-radiation beams corresponding in number to the plurality of diode-laser bar stacks;
a lens having positive optical power in the fast-axis;
a first diffractive optical element following the lens in the direction of propagation of the output radiation beams, the combination of the lens and the first diffractive optical element being configured and arranged to spread the plurality of output-radiation beams from the stacks of diode-laser bars into a line of radiation in the working plane such that each beam contributes about equally to the length of the line of radiation, with the line of radiation having a length in the fast axis direction and a width in the slow-axis direction.

18. The apparatus of claim 17, further including a second diffractive optical element following the first diffractive optical element in the direction of propagation of the output-radiation beams, the second diffractive optical element being configured for optimizing uniformity of illumination in the line of radiation.

19. Optical apparatus for forming a line of radiation having a length and a width in a working plane at a working distance from the apparatus, the apparatus comprising:
a plurality of spaced-apart stacks of diode-laser bars, each of the diode-laser bars having a plurality of diode-laser emitters, and having a fast-axis and a slow-axis perpendicular to the fast-axis and parallel to a length dimension of the bars, the diode-laser bars in the stacks stacked in the fast-axis direction thereof, and the diode-laser bar stacks being aligned with each other in the fast-axis direction, with radiation from the diode-laser bar stacks propagating parallel to a propagation axis perpendicular to the fast and slow-axes;
a plurality of collimating arrangements corresponding in number to the number of diode-laser bars for collimating the output radiation of the diode-laser bars in the diode-laser bars stacks in at least the fast-axis direction, thereby forming a plurality of output-radiation beams corresponding in number to the plurality of diode-laser bar stacks;

a first optical element having optical power in the fast-axis only;

a first diffractive optical element following the lens in propagation-axis direction;

a second diffractive optical element following the first diffractive element in the propagation-axis direction;

a second optical element following the lens in the in the propagation-axis direction and having optical power in the slow-axis only;

a third optical element following the second diffractive element in the propagation-axis direction and having optical power in the fast-axis only; and a fourth optical element following the third optical element in the propagation-axis direction and having optical power in the slow-axis only, the combination of the first and third optical elements and the diffractive optical elements being configured and arranged to spread the plurality of output-radiation beams from the stacks of diode-laser bars in the working plane in the fast-axis direction to form the length of the line of radiation, and the second and fourth optical elements focusing the plurality of output-radiation beams in the slow-axis in the working plane to form the width of the line of radiation.

20. The apparatus of claim 19, wherein the first diffractive optical element is configured to provide primarily the spreading of the output-radiation beams, and the second optical element is configured primarily to optimize uniformity of illumination along the line of radiation.

\* \* \* \* \*

UNITED STATES PATENT AND TRADEMARK OFFICE
CERTIFICATE OF CORRECTION

PATENT NO. : 8,547,641 B2  
APPLICATION NO. : 12/942877  
DATED : October 1, 2013  
INVENTOR(S) : Nadia Capolla Page 1 of 1

It is certified that error appears in the above-identified patent and that said Letters Patent is hereby corrected as shown below:

On the Title page, at item (73) Assignee, delete "Cohernet, Inc., Santa Clara, CA (US)" and insert -- Coherent, Inc., Santa Clara, CA (US) --, therefor.

Signed and Sealed this  
Twelfth Day of November, 2013

Teresa Stanek Rea  
*Deputy Director of the United States Patent and Trademark Office*